(12) United States Patent
Jones et al.

(10) Patent No.: US 6,351,136 B1
(45) Date of Patent: Feb. 26, 2002

(54) PASSIVE VOLTAGE LIMITER

(75) Inventors: Jeff R. Jones, Beaverton; Chee How Lim, Hillsboro, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/457,239

(22) Filed: Dec. 8, 1999

(51) Int. Cl.$^7$ .............. H03K 17/16; H03K 5/12
(52) U.S. Cl. .................. 326/30; 326/83; 326/86; 327/112; 327/170
(58) Field of Search .............. 326/21–27, 30, 326/81, 83, 86, 87; 327/112, 170, 307, 309, 389, 391, 534, 537

(56) References Cited

U.S. PATENT DOCUMENTS

| | | | | |
|---|---|---|---|---|
| 4,748,426 A | * | 5/1988 | Sewart .................. 333/22 R |
| 5,654,860 A | | 8/1997 | Casper et al. ............ 361/91 |
| 5,654,981 A | * | 8/1997 | Mahant-Shetti et al. ... 375/219 |
| 5,801,563 A | * | 9/1998 | McClure .................. 327/170 |
| 5,811,984 A | * | 9/1998 | Long et al. ............ 326/30 |
| 5,819,099 A | * | 10/1998 | Ovens ................ 395/750.01 |
| 5,936,429 A | * | 8/1999 | Tomita .................. 328/82 |
| 6,043,702 A | * | 3/2000 | Singh ................... 327/534 |
| 6,046,653 A | * | 4/2000 | Yamada ................. 333/32 |
| 6,084,432 A | * | 7/2000 | Dreps et al. ........... 326/83 |
| 6,133,755 A | * | 10/2000 | Huang et al. ........... 326/83 |

* cited by examiner

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

A circuit for providing protection to active termination devices and drive circuits from overshoot and undershoot noise is disclosed. The circuit includes an interconnect node, an active termination device, a drive circuit, and a voltage limiter for controlling noise overshoot and undershoot at the interconnect node. The voltage limiter controls the impedance at the interconnect node and the voltage swing at the interconnect node. Controlling the impedance reduces the overshoot and undershoot noise at the interconnect node. Controlling the voltage swing reduces the voltage swings across the transistors in the active termination devices and the drive circuits, which reduces the effects of overshoot and undershoot noise on the active termination devices and the drive circuits. The result is less stress on the oxide layers in the transistors and an increased transistor lifetime.

18 Claims, 7 Drawing Sheets

US 6,351,136 B1

PASSIVE VOLTAGE LIMITER

FIELD OF THE INVENTION

The present invention relates to digital systems, and more particularly to controlling noise signals in digital systems.

BACKGROUND

In the transmission of signals, a mismatch between a transmission line impedance and a receiver impedance can result in overshoot and undershoot noise. The presence of overshoot and undershoot noise in a digital system degrades the insulating properties of the oxide layers of active termination circuits, and after a certain amount of degradation the termination circuits fail.

FIG. 1A is a schematic diagram of prior art circuit 100 for receiving and transmitting digital signals. Transistor 106 is capable of driving signals onto a transmission line coupled to pad 103. Active termination circuit 109 including transistor 112 provides an active pull-up for receiving signals at pad 103. One disadvantage of prior art circuit 100 is that for signals that include overshoot or undershoot noise at pad 103, the gate-to-drain voltage 115 of transistor 112 is greater than the difference between source supply voltage $V_{TT}$ and the output low voltage $V_{OL}$. The repeated application of this increased voltage across the gate and drain of transistor 112 stresses the gate oxide layer, causes the performance of transistor 112 to degrade, and eventually causes transistor 112 to fail.

FIG. 1B is an illustration of undershoot noise in digital signal waveform 118. Voltage 121 is the voltage applied between the gate and drain of transistor 112 as a result of the undershoot noise voltage. Voltage 124 is the voltage applied between the gate and drain of transistor 112 after the undershoot noise settles out. Voltage 121 is greater than voltage 124 and the repeated application of voltage 121 between the gate and drain of transistor 112 causes the insulating properties of the gate oxide of transistor 112 to degrade.

FIG. 1C is a block diagram of prior art system 127 for suppressing overshoot and undershoot noise in a digital system. FIG. 1C shows prior art system 100 shown in FIG. 1A coupled to edge detect and timer circuit 130 and transistors 133 and 136. Transistors 133 and 136 are coupled to pad 103. In operation, edge detect and timer circuit 130 turns on transistor 133 or transistor 136 to suppress overshoot and undershoot noise at pad 103. Whenever a rising edge is detected at pad 103, transistor 136 is turned on for a predetermined period of time to clamp the overshoot noise level. Similarly, whenever a falling edge is detected, transistor 133 is turned on for a predetermined period of time to clamp the undershoot noise level.

Unfortunately, not all overshoot and undershoot noise coincides with a rising or falling edge at pad 103. For example, some overshoot and undershoot noise results from the coupling of switching transients from neighboring lines to transmission lines coupled to pad 103. These transients are not suppressed by edge detect and timer circuit 130. A second problem with edge detect and timer circuit 130 is that transistors 133 and 136, typically n-type metal-oxide semiconductor (n-MOS) and p-type metal-oxide semiconductor (p-MOS) transistors, respectively, require a large amount of chip real estate near pad 103, which decreases the amount of real estate available for information processing circuits. Still another problem with edge detect and timer circuit 130 is that accurate timing of the clamping function is critical to successful operation of the circuit. Releasing the clamping too early results in over voltage or under voltage noise on the signal line, and holding the clamping too long reduces the data rate on the signal line.

For these and other reasons there is a need for the present invention.

SUMMARY OF THE INVENTION

A circuit comprises an active termination device for pulling up an interconnect node, a transistor for driving the interconnect node, and a passive voltage limiter coupled to the interconnect node. The passive voltage limiter also couples the transistor to the active termination device.

DESCRIPTION

The present invention reduces overshoot and undershoot noise voltages at interconnect nodes in a digital system. By reducing the overshoot and undershoot noise voltages at the interconnect nodes, active termination devices coupled to the nodes are protected from potentially damaging over voltages. As described in greater detail below, a circuit and method are provided for reducing the voltage output high level at the interconnect nodes, which reduces overshoot and undershoot noise voltages at the nodes.

Figure 1B:
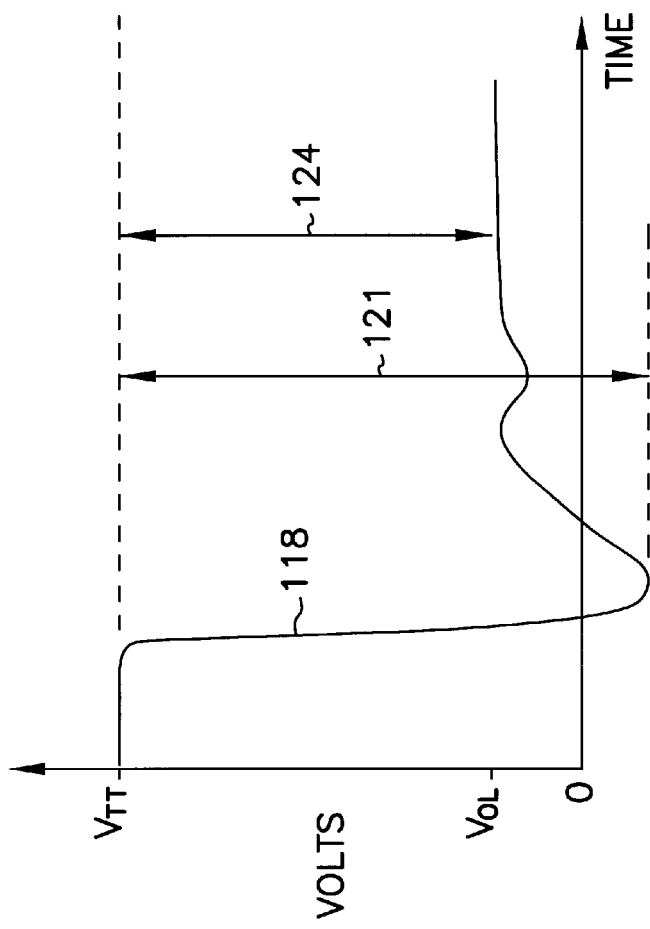
FIG. 1B is an illustration of undershoot noise in a digital signal waveform.
Figure 1A:
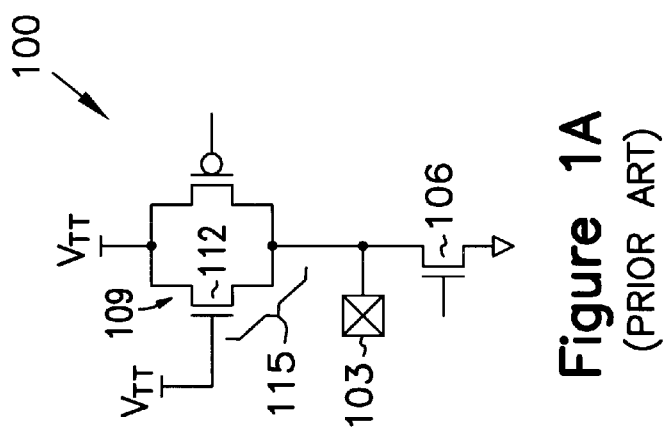
FIG. 1A is a schematic diagram of a prior art circuit for receiving and sending digital signals.
Figure 1C:
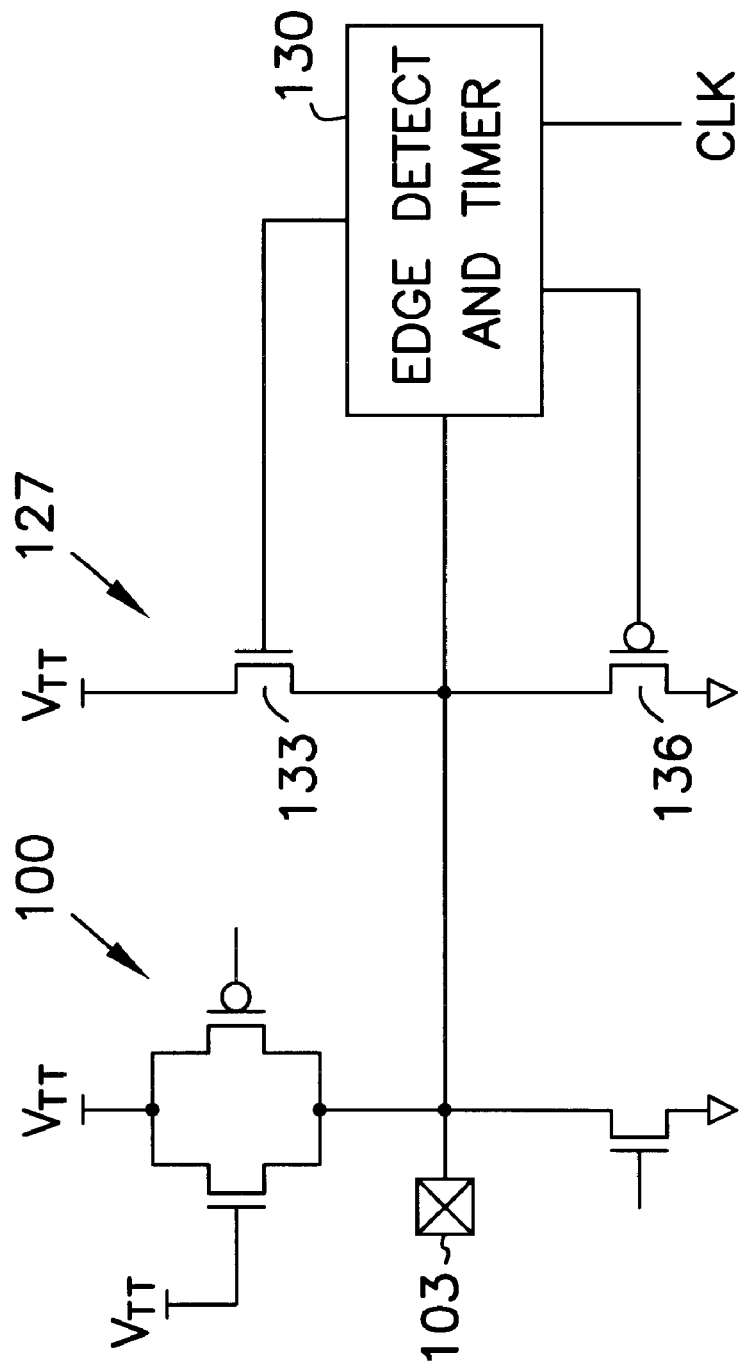
FIG. 1C is a block diagram of a prior art system for suppressing overshoot noise and undershoot noise in a digital system.
Figure 2B:
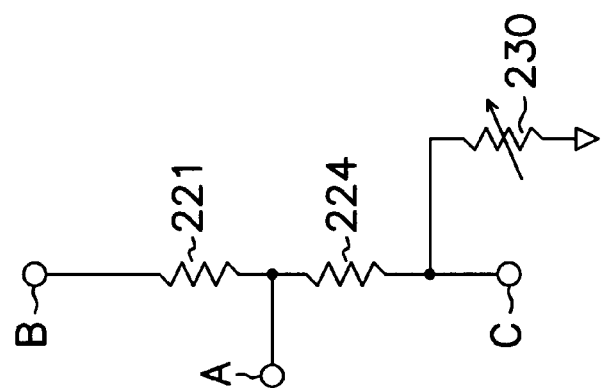
FIG. 2B is a schematic diagram for one embodiment of the voltage limiter shown in FIG. 2A.
Figure 2A:
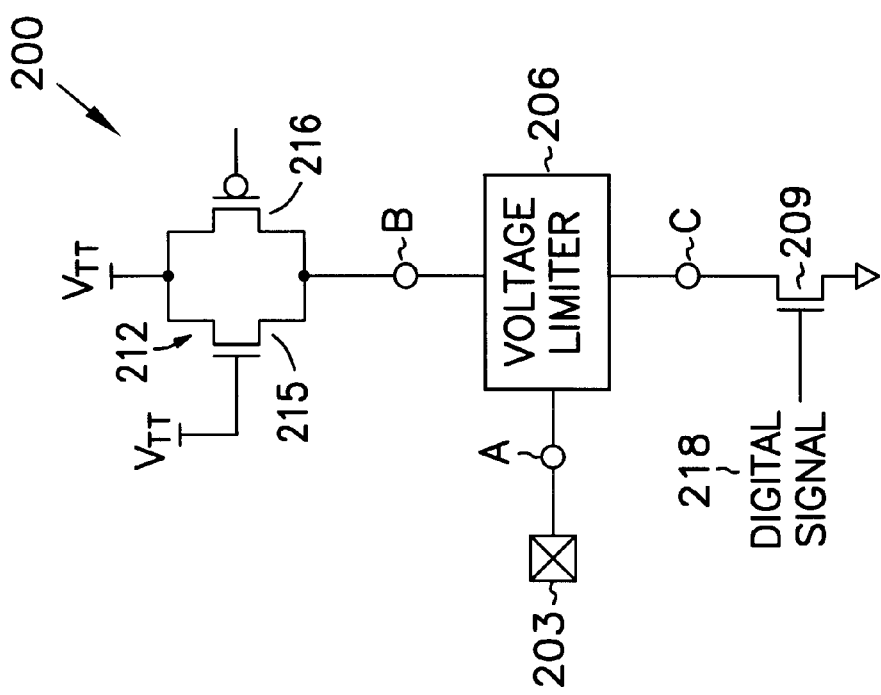
FIG. 2A is a block diagram for one embodiment of a circuit capable of suppressing overshoot and undershoot noise in a digital system.

FIG. 2A is a block diagram for one embodiment of circuit 200 capable of suppressing the effects of overshoot and undershoot noise in a digital system. An interconnect node, such as pad 203, is coupled to voltage limiter 206. Voltage limiter 206 couples transistor 209 to active termination device 212 including transistors 215 and 216. As shown in FIG. 2A, the gate of transistor 215 and the source terminals of transistors 215 and 216 are coupled to supply voltage $V_{TT}$.

Transistor 209 is not limited to a particular type of transistor. Any transistor capable of functioning as a highspeed active pull-down switch and having sufficient drive capability to drive a transmission line coupled to pad 203 is suitable for use in connection with the present invention. Types of transmission lines commonly coupled to pad 203 include strip lines, integrated circuit interconnects, coaxial cables, and flex cables. For one embodiment, transistor 209 is an n-type transistor fabricated using a complementary metal-oxide semiconductor (CMOS) process.

Active termination device 212 provides an active pull-up signal to logic gates coupled to pad 203. The present invention is not limited to a particular type of active termination device. Any active device configured such that the device experiences performance degradation over time from repeated applications of overshoot and undershoot noise voltages is suitable for use in connection with the present invention. Active termination device 212, in one embodiment, is fabricated from a pair of CMOS transistors.

Voltage limiter 206 protects transistor 215 from undershoot noise voltages. Protection is achieved without timing or tuning circuits. For one embodiment, a resistive device that acts as a voltage divider is provided in voltage limiter 206 to reduce the voltage at the drain terminal of transistor 215. Voltage limiter 206, for one embodiment, is fabricated from passive components, such as resistors, which permits manufacturing voltage limiter 206 to tight specifications and controlling the voltage at the drain terminal of transistor 215 precisely. Avoiding the use of amplifiers and comparators in the fabrication of voltage limiter 206 avoids the costs associated with supplying power to the active components and the costs associated with lower manufacturing yields commonly experienced in the fabrication of active components.

In operation, digital signals corrupted by overshoot and undershoot noise are transmitted and received at pad 203 of circuit 200. Voltage limiter 206 reduces the gate-to-drain voltage of transistor 215 for an undershoot noise voltage at pad 203. Without voltage limiter 206 coupling active termination device 212 to transistor 209, the entire voltage drop between the supply voltage $V_{TT}$ and pad 203 resulting from an undershoot noise voltage signal occurs across the gate and drain of transistor 215. By coupling active termination device 212 to transistor 209 with voltage limiter 206, the voltage drop between the gate of transistor 212 and pad 203 can be split between a drop across transistor 212 and a drop across a passive impedance incorporated in voltage limiter 206. This serves to lower the voltage swing between the gate and drain of transistor 212. Voltage limiter 206, in a similar manner, also reduces the gate-to-source voltage of transistor 209 for an overshoot noise voltage at pad 203.

FIG. 2B is a schematic diagram for one embodiment of the voltage limiter 206 shown in FIG. 2A. This embodiment can be substituted for voltage limiter 206 shown in FIG. 2A by disconnecting voltage limiter 206 at nodes A, B, and C and inserting the circuit shown in FIG. 2B at nodes A, B, and C. The embodiment shown in FIG. 2B includes series coupled resistors 221 and 224 coupled in series with variable resistor 230. A single interconnect couples resistors 221 and 224 to pad 203. Fixed resistors 221 and 224, for one embodiment, are n-well resistors. The values of fixed resistors 221 and 224 are selected to lower the voltage output high level signal at pad 203 by about ten percent from the supply voltage $V_{TT}$. The impedance value of active termination device 212, shown in FIG. 2A, and the impedance value of variable impedance 230 are selected to match the impedance of the transmission line coupled to pad 203. For one embodiment, the impedance value of active termination device 212 is fifty-six ohms and the impedance value of variable impedance 230 is 560 ohms. Inserting resistor 221 between the gate of transistor 215 and pad 203 permits a portion of the voltage between supply voltage $V_{TT}$ at the gate of transistor 215 and the undershoot noise voltage at pad 203 to be dropped across resistor 221. This reduces the gate-to-drain voltage at transistor 215 for a signal containing an undershoot noise voltage at pad 203. For an alternate embodiment, resistor 221 is coupled in series with resistor 224, and variable resistor 230 is dropped.

Figure 2C:
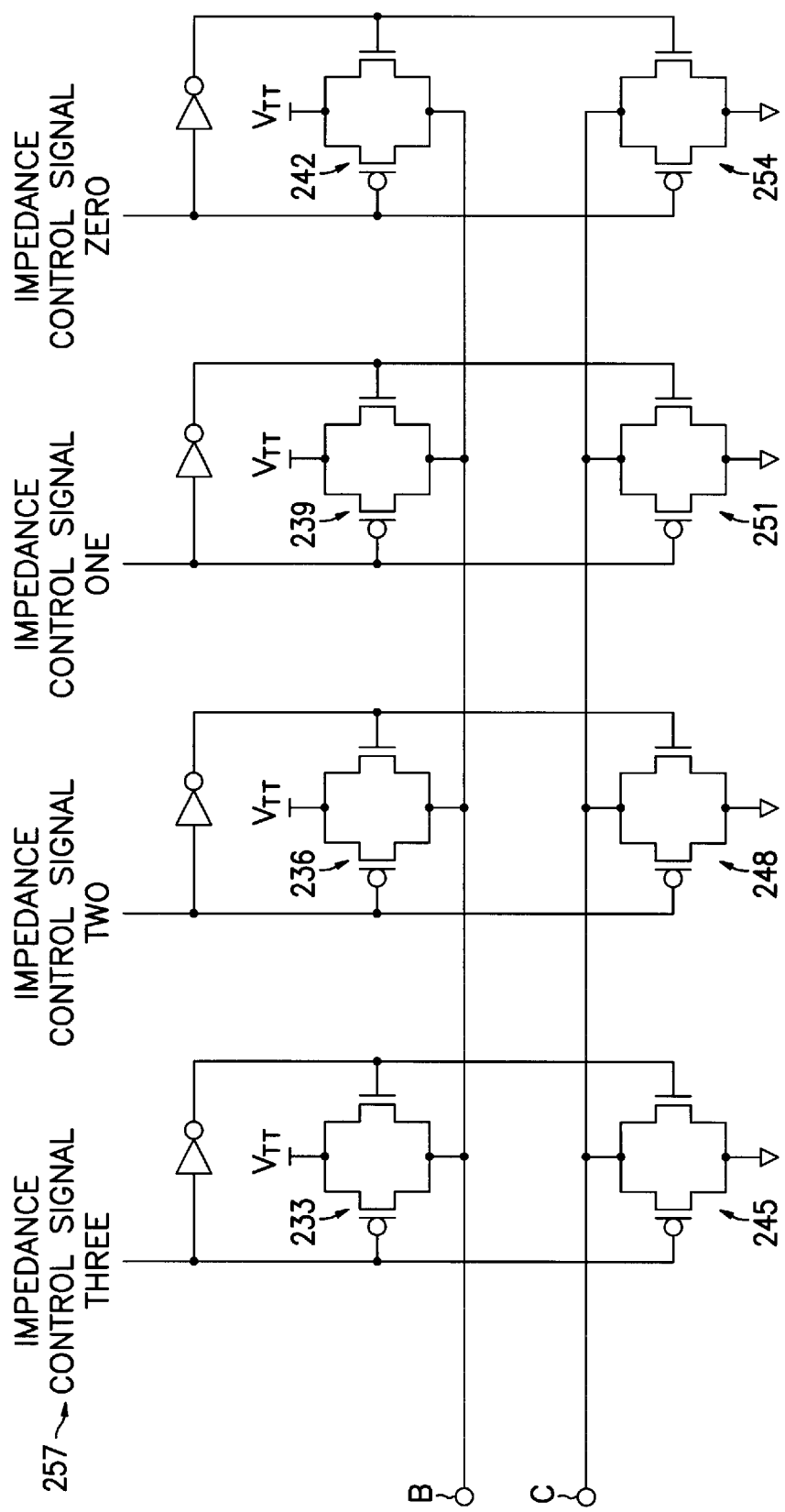
FIG. 2C is a schematic diagram for one embodiment of the variable impedance shown in FIG. 2B coupled to a plurality of active termination devices.

FIG. 2C is a schematic diagram for one embodiment of variable impedance 230, shown in FIG. 2B, coupled to a plurality of active termination devices, such as active termination device 212, shown in FIG. 2A. This embodiment can be substituted for variable impedance 230, shown in FIG. 2B, by disconnecting variable impedance 230 at node C, and inserting the circuit shown in FIG. 2C at nodes B and C of FIG. 2B. The embodiment shown in FIG. 2C includes a first plurality of pass gates 233, 236, 239, and 242 connected in parallel and a second plurality of pass gates 245, 248, 251, and 254 connected in parallel. Each pass gate in the first plurality of pass gates 233, 236, 239, and 242 has one terminal connected to the positive power supply $V_{TT}$, one terminal connected to a signal line, and two terminals connected to control lines. Each pass gate in the second plurality of pass gates 245, 248, 251, and 254 has one terminal connected to ground, one terminal connected to a signal line, and two terminals connected to a control line. For one embodiment, each pass gate among the first plurality of pass gates is paired with a pass gate from among the second plurality of pass gates, and each pair of pass gates is switched on and off by a single control signal. For example, pass gate 233 is paired with pass gate 245, and impedance control signal three 257 switches pass gates 233 and 245 on and off in tandem. Each pass gate is designed to have a particular impedance when turned on and a high impedance approximating an open circuit when turned off. For one embodiment, when turned on, each of the pass gates 233, 236, 239, and 242 has a value a factor of ten less than the pass gate 245, 248, 251, and 254 that it is paired with. For one embodiment, the pass gates are controlled to provide a 56 ohm impedance at pad 203. For an alternate embodiment, only the first plurality of pass gates 233, 236, 239, and 242 are included. For one embodiment, each of the second plurality of pass gates 245, 248, 251, and 254 is a digitally controllable resistive device.

Voltage limiter 206, by including a variable impedance capability for one embodiment, is capable of improving the performance of systems operating in an environment in which transmission line impedances change over time. Noise overshoot and undershoot voltages in such systems can be reduced by varying the impedance at pad 203. For example, if the impedance of a transmission line coupled to pad 203 changes due to a temperature change in the operating environment, the impedance at pad 203 can be varied to match the transmission line impedance.

Figure 3A:
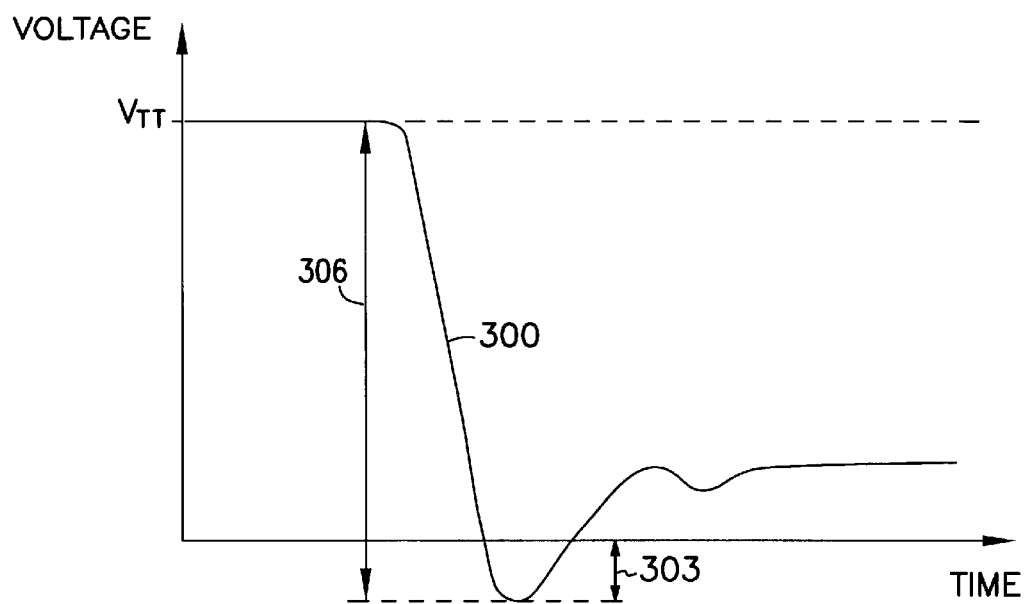
FIG. 3A is an illustration of a digital signal waveform containing undershoot noise.

FIG. 3A is an illustration of digital signal waveform 300 containing undershoot noise. Waveform 300 is an example of a voltage signal arriving at pad 103 of FIG. 2A in the absence of voltage limiter 206. The undershoot noise voltage is the incremental voltage 303 that appears below ground. However, in the absence of voltage limiter 206, the entire voltage difference 306 appears across the gate and drain of transistor 215. In the worst case, voltage difference 306 destroys transistor 215. Otherwise, over time, the repeated application of voltage difference 306 to transistor 215 degrades the insulating characteristics of the gate oxide of transistor 215, which causes degradation in the performance of transistor 215.

Figure 3B:
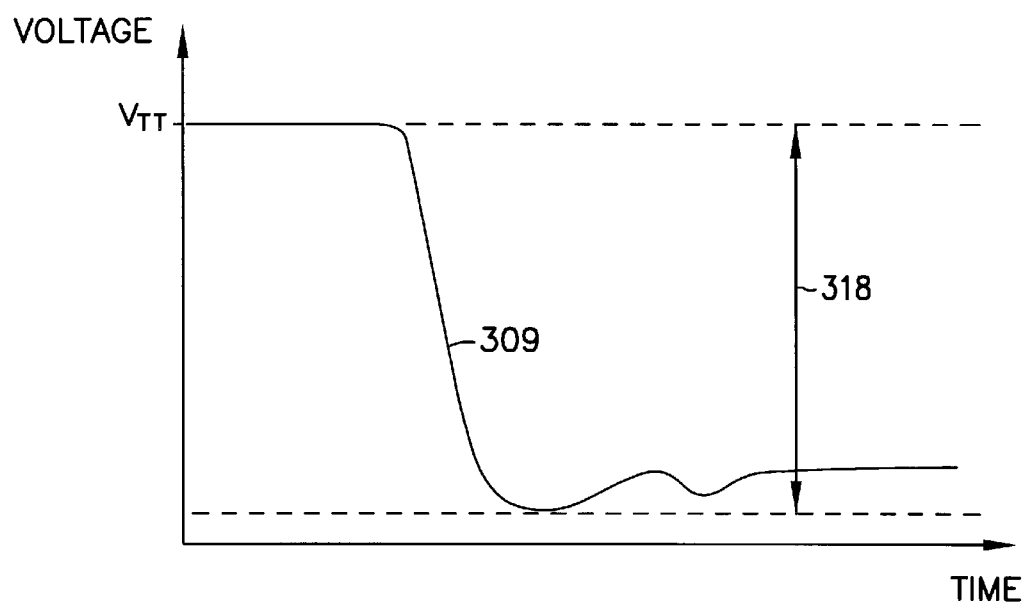
FIG. 3B is an illustration of digital signal waveform containing undershoot noise at an interconnect node coupled to one embodiment of the present invention.

FIG. 3B is an illustration of digital signal waveform 309 containing undershoot noise at a pad coupled to one embodiment of the present invention. Digital signal waveform 309 is a voltage waveform as seen across transistor 215 of FIG. 2A with the voltage limiter of FIG. 2B, including resistor 221, substituted for voltage limiter 206 in FIG. 2A. The resulting difference voltage 318 is less than difference voltage 306 shown in FIG. 3A, and therefore the gate-to-drain voltage at transistor 215 is reduced, and the insulating characteristics of the gate oxide of transistor 215 are not degraded.

Figure 3C:
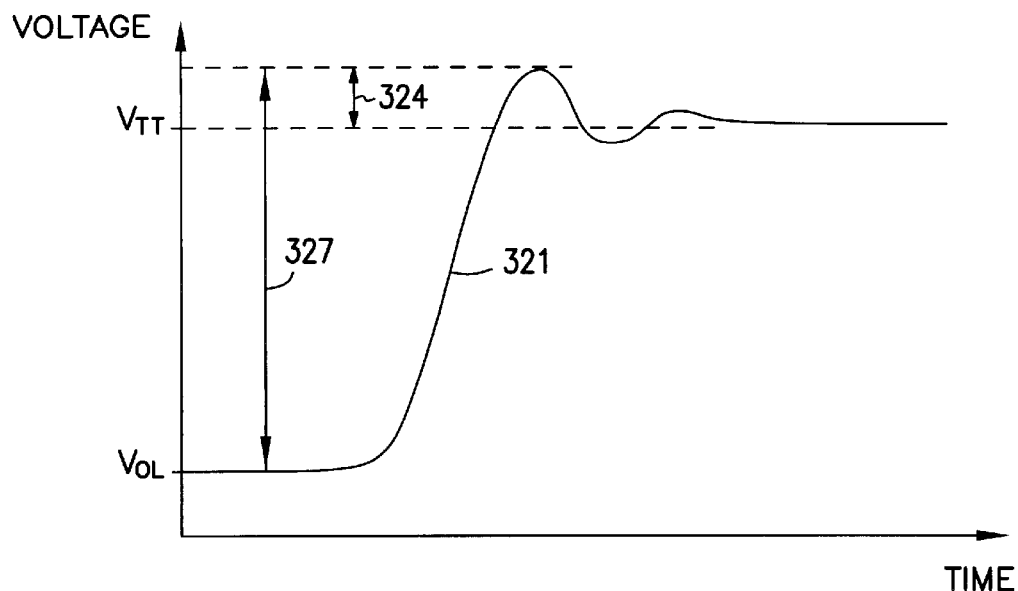
FIG. 3C is an illustration of a digital signal waveform containing overshoot noise.

FIG. 3C is an illustration of digital signal waveform 321 containing overshoot noise. Waveform 321 is an example of a voltage signal arriving at pad 203 of FIG. 2A in the absence of voltage limiter 206. The overshoot noise voltage is the incremental voltage 324 that appears above $V_{TT}$. However, in the absence of voltage limiter 206, the entire voltage difference 327 appears across the gate and source of transistor 209. In the worst case, voltage difference 327 destroys transistor 209. Otherwise, over time, the repeated application of voltage difference 327 to transistor 209 degrades the insulating characteristics of the gate oxide of transistor 209, which causes degradation in the performance of transistor 209.

Figure 3D:
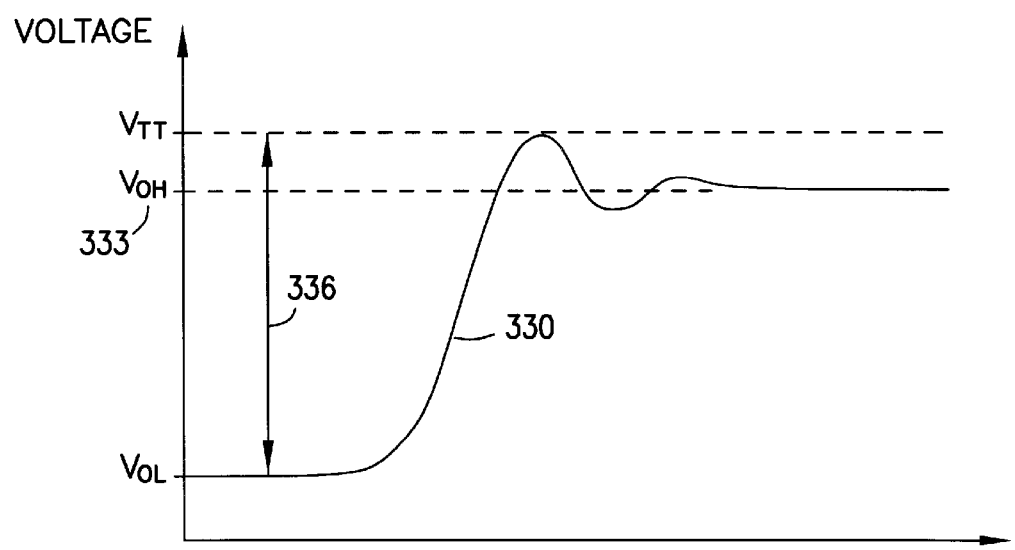
FIG. 3D is an illustration of a digital signal waveform containing overshoot noise at an interconnect node coupled to one embodiment of the present invention.

FIG. 3D is an illustration of digital signal waveform 330 containing overshoot noise at a pad coupled to one embodiment of the present invention. Waveform 330 is an example of a waveform for a voltage signal arriving at pad 203 of FIG. 2A. The overshoot noise voltage is the incremental voltage that appears above $V_{TT}$. However, voltage limiter 206 reduces the voltage output high $V_{OH}$ voltage level 333 below the supply voltage $V_{TT}$, and as a result the peak of the noise overshoot voltage has been reduced below $V_{TT}$. The resulting difference voltage 336 is less than the difference voltage 327 shown in FIG. 3A, and therefore the gate-to-source voltage at transistor 209 is reduced, and the insulating characteristics of the gate oxide of transistor 209 are not degraded.

Figure 4:
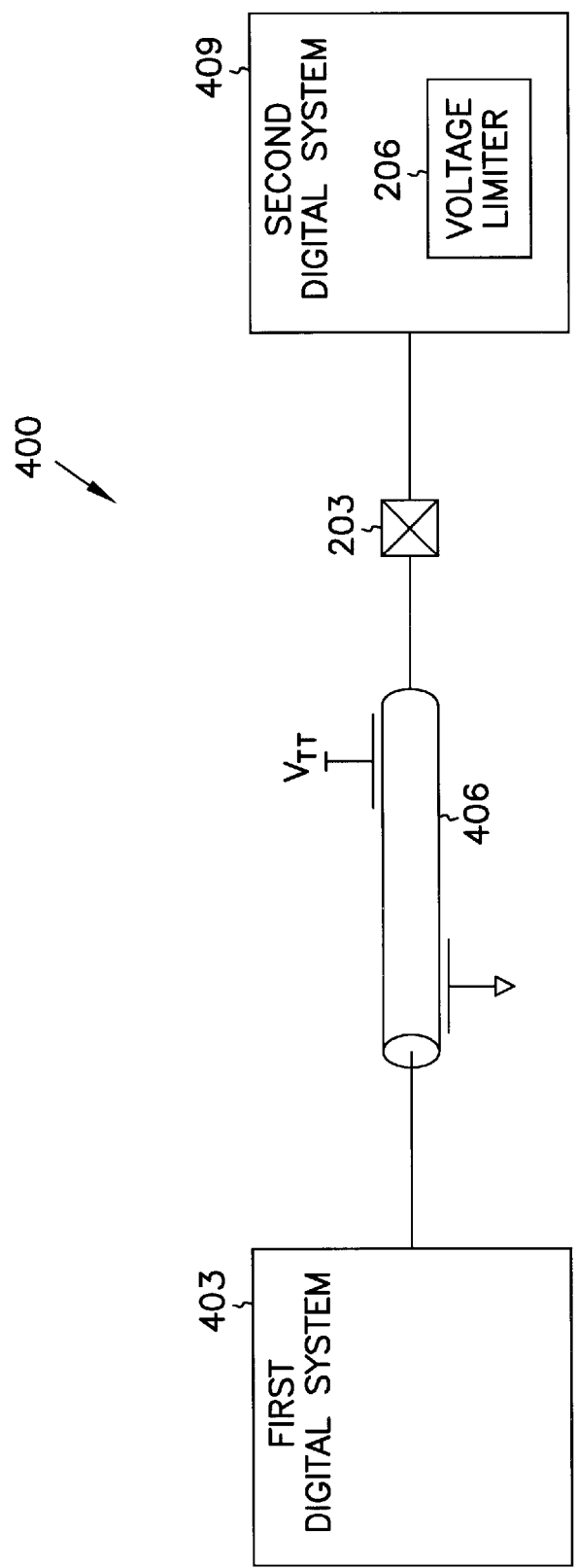
FIG. 4 is a block diagram of a digital system incorporating one embodiment of a noise suppression circuit of the present invention.

FIG. 4 is a block diagram of digital system 400 incorporating one embodiment of a noise suppression circuit of the present invention. In operation, first digital system 403 generates a digital signal that is transmitted over transmission line 406 to second digital system 409. For one embodiment, first digital system 403 and second digital system 409 are microprocessors. For an alternate embodiment, first digital system 403 is a board level chip set, and second digital system 409 is a microprocessor. For still another alternate embodiment, first digital system 403 and second digital system 409 are digital systems fabricated using a complementary metal-oxide semiconductor (CMOS) process. For still another alternate embodiment, first digital system 403 is a digital signal processor. Voltage limiter 206 is capable of adapting the terminating impedance seen by transmission line 406 to reduce noise overshoot and undershoot voltage at pad 203. However, if noise overshoot and undershoot voltages are not completely eliminated by matching the terminating impedance, then voltage limiter 206 is also capable of reducing the voltage output high level, which reduces any residual undershoot and overshoot noise voltages.

Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A circuit comprising:
    an active termination device for pulling up a pad;
    a transistor for driving the pad; and
    a passive voltage limiter including a variable resistor coupled to the pad and coupling the transistor to the active termination device, wherein the variable resistor is coupled in parallel with the transistor.

2. The circuit of claim 1, wherein the active termination device comprises:
    a first transistor; and
    a second transistor coupled in parallel with the first transistor.

3. A circuit comprising:
    an active termination device for pulling up an interconnect node;
    a transistor for driving the interconnect node; and
    a passive voltage limiter coupled to the interconnect node and coupling the transistor to the active termination device, wherein the voltage limiter comprises:
        a first fixed n-well resistor;
        a second fixed n-well resistor serially connected to the first fixed n-well transistor; and
        a controllable impedance circuit coupled to the first fixed n-well resistor.

4. A circuit comprising:
    an active termination device for pulling up an interconnect node;
    a transistor for driving the interconnect node; and
    a passive voltage limiter coupled to the interconnect node and coupling the transistor to the active termination device, wherein the voltage limiter comprises:
        a first fixed n-well resistor;
        a second fixed n-well resistor serially connected to the first fixed n-well transistor; and
        a controllable impedance circuit coupled to the first fixed n-well resistor, wherein a single interconnect couples the first n-well resistor and the second n-well resistor to an interconnect node.

5. A circuit comprising:
    an active termination device for pulling up an interconnect node;
    a transistor for driving the interconnect node; and
    a passive voltage limiter coupled to the interconnect node and coupling the transistor to the active termination device, wherein the voltage limiter comprises:
        a first fixed n-well resistor;
        a second fixed n-well resistor serially connected to the first fixed n-well transistor; and
        a controllable impedance circuit coupled to the first fixed n-well resistor, wherein a single interconnect couples the first n-well resistor and the second n-well resistor to an interconnect node, and wherein the controllable impedance circuit comprises:
            a first variable resistive load coupled to the first fixed n-well resistor; and
            a second variable resistive load coupled to the to the second fixed n-well resistor.

6. A circuit comprising:
an active termination device for pulling up an interconnect node;
a transistor for driving the interconnect node; and
a passive voltage limiter coupled to the interconnect node and coupling the transistor to the active termination device, wherein the voltage limiter comprises:
a first fixed n-well resistor;
a second fixed n-well resistor serially connected to the first fixed n-well transistor; and
a controllable impedance circuit coupled to the first fixed n-well resistor, wherein a single interconnect couples the first n-well resistor and the second n-well resistor to an interconnect node, and wherein the controllable impedance circuit comprises:
a first variable resistive load coupled to the first fixed n-well resistor; and
a second variable resistive load coupled to the to the second fixed n-well resistor, wherein the second variable resistive load comprises:
a plurality of parallel selectable pass gates in series with the first fixed n-well resistor.

7. A circuit comprising:
a pad;
a pull-up circuit;
a pull-down circuit; and
a passive voltage limiter including a variable resistor coupled to the pad and coupled in series with the pull-up circuit and the pull-down circuit, wherein the variable resistor is coupled in parallel with the pull-down circuit.

8. A circuit comprising:
an interconnect node;
a pull-up circuit;
a pull-down circuit; and
a passive voltage limiter coupled to the interconnect node and coupled in series with the pull-up circuit and the pull-down circuit, wherein the pull-up circuit comprises:
an active termination device; and
a plurality of parallel pass gates coupled to the active termination device.

9. A circuit comprising:
an interconnect node;
a pull-up circuit;
a pull-down circuit; and
a passive voltage limiter coupled to the interconnect node and coupled in series with the pull-up circuit and the pull-down circuit, wherein the voltage limiter comprises:
a plurality of fixed n-well transistors coupled to the pad.

10. A circuit comprising:
an interconnect node;
a pair of CMOS transistors;
an n-MOS transistor; and
a passive voltage limiter including a variable resistor, the passive voltage limiter being coupled to the interconnect node and coupling the pair of CMOS transistors to the n-MOS transistor, wherein the variable resistor is coupled in parallel with the n-MOS transistor.

11. A circuit comprising:
an interconnect node;
a pair of CMOS transistors;
an n-MOS transistor; and
a voltage limiter coupled to the interconnect node and coupling the pair of CMOS transistors to the n-MOS transistor, wherein the voltage limiter comprises:
a fixed impedance; and
a pair of controllable pass circuits coupled to the fixed impedance.

12. A circuit comprising:
a first transistor;
a second transistor;
a plurality of paired pass gates wherein one of each pair of the plurality of paired pass gates is coupled to a first resistor coupled to the first transistor and one of each pair of the plurality of paired pass gates is coupled to a second resistor coupled to the second transistor; and
an interconnect node coupled to the first resistor and the second resistor.

13. A circuit comprising:
an active termination device;
a voltage limiter coupled to the active termination device, the voltage limiter including a first plurality of selectable resistive devices coupled to a first fixed resistive device, and a second plurality of selectable resistive devices coupled to a second fixed resistive device, wherein each of the first plurality of selectable resistive devices is paired with at least one of the second plurality of resistive devices; and
a transistor coupled to the voltage limiter.

14. A circuit comprising:
an active termination device;
a voltage limiter coupled to the active termination device, the voltage limiter including a first plurality of selectable resistive devices coupled to a first fixed resistive device, and a second plurality of selectable resistive devices coupled to a second fixed resistive device, wherein each of the first plurality of selectable resistive devices is paired with at least one of the second plurality of resistive devices; and
a transistor coupled to the voltage limiter, wherein the active termination device comprises:
an n-MOS transistor; and
a p-MOS transistor coupled in parallel with the n-MOS transistor.

15. A circuit comprising:
an active termination device;
a voltage limiter coupled to the active termination device, the voltage limiter including a first plurality of selectable resistive devices coupled to a first fixed resistive device, and a second plurality of selectable resistive devices coupled to a second fixed resistive device, wherein each of the first plurality of selectable resistive devices is paired with at least one of the second plurality of resistive devices; and
a transistor coupled to the voltage limiter, wherein each of the first plurality of selectable resistive devices is a pass gate.

16. A system comprising:
a first digital system;
a second digital system including a voltage limiter; and
a transmission line coupling the first digital system to the voltage limiter, wherein the voltage limiter comprises:
a pair of serially connected fixed resistors; and
a plurality of digitally controllable discrete resistive devices coupled to only one of the pair of serially connected fixed resistors.

17. A system comprising:

a first digital system;

a second digital system including a voltage limiter; and a transmission line coupling the first digital system to the voltage limiter, wherein the voltage limiter comprises:

a pair of serially connected fixed resistors; and a plurality of digitally controllable discrete resistive devices coupled to only one of the pair of serially connected fixed resistors, wherein the plurality of controllable discrete resistive devices comprises:

a plurality of controllable pass gates.

18. A method comprising:

passively lowering a voltage output high level at an interconnect node having a controllable impedance including a variable resistor;

varying the variable resistor; and receiving a signal at the interconnect node.

* * * * *

UNITED STATES PATENT AND TRADEMARK OFFICE
CERTIFICATE OF CORRECTION

PATENT NO.   : 6,351,136
DATED        : February 26, 2002
INVENTOR(S)  : Jones et al.

It is certified that error appears in the above-identified patent and that said Letters Patent is hereby corrected as shown below:

<u>Column 7,</u>
Line 19, delete "to the to the" and insert -- to the --, therefor.

Signed and Sealed this

Twenty-first Day of May, 2002

*Attest:*

*Attesting Officer*

JAMES E. ROGAN
*Director of the United States Patent and Trademark Office*